US012742804B2

(12) United States Patent
Schumi et al.

(10) Patent No.: US 12,742,804 B2
(45) Date of Patent: Sep. 22, 2026

(54) INTEGRATED ACTIVE ISOLATION MEASUREMENT

(71) Applicant: Infineon Technologies AG, Neubiberg (DE)

(72) Inventors: Stefan Schumi, Munich (DE); Michael Krug, Munich (DE); Ordwin Haase, Neubiberg (DE)

(73) Assignee: Infineon Technologies AG, Neubiberg (DE)

( * ) Notice: Subject to any disclaimer, the term of this patent is extended or adjusted under 35 U.S.C. 154(b) by 148 days.

(21) Appl. No.: 18/752,363

(22) Filed: Jun. 24, 2024

(65) Prior Publication Data

US 2025/0389762 A1 Dec. 25, 2025

(51) Int. Cl.

| | |
|---|---|
| ***G01R 27/02*** | (2006.01) |
| ***B60L 3/00*** | (2019.01) |
| ***G01R 31/00*** | (2006.01) |
| ***G01R 31/52*** | (2020.01) |

(52) U.S. Cl.

CPC ......... *G01R 27/025* (2013.01); *G01R 31/007* (2013.01); *G01R 31/52* (2020.01); *B60L 3/0069* (2013.01); *B60L 2240/547* (2013.01)

(58) Field of Classification Search

CPC .... G01R 27/025; G01R 31/007; G01R 31/52; G01R 27/18; G01R 31/006; B60L 3/0069; B60L 2240/547

See application file for complete search history.

(56) References Cited

U.S. PATENT DOCUMENTS

| | | | | |
|---|---|---|---|---|
| 2012/0105220 | A1* | 5/2012 | Wang | H01M 10/425 324/426 |
| 2015/0168480 | A1* | 6/2015 | Robin | G01R 31/52 324/551 |
| 2018/0222342 | A1* | 8/2018 | Comesaña | B60L 3/12 |
| 2022/0011377 | A1* | 1/2022 | Nakayama | G01R 31/52 |
| 2025/0076353 | A1* | 3/2025 | Healy | G01R 31/389 |

OTHER PUBLICATIONS

"Electrically Propelled Road Vehicles—Conductive Power Transfer—Safety Requirements," International Standard ISO 17409, Second Edition, Feb. 2020, 13 pp.

"Electrically Propelled Road Vehicles—Safety Specifications—Part 3: Electrical Safety," International Standard ISO 6469-3, Fourth Edition, Oct. 2021, 12 pp.

"Isometer IR155-3203/IR155-3204," retrieved from https://www.bender.de/en/products/insulation-monitoring/isometer-ir155-3203-ir155-3204/, on May 23, 2024, 8 pp.

* cited by examiner

*Primary Examiner* — Daniel R Miller

(74) *Attorney, Agent, or Firm* — Shumaker & Sieffert, P.A.

(57) ABSTRACT

An example isolation measurement circuit includes a first switch connecting a first isolation resistor to a terminal of a measurement resistor, the first isolation resistor also connecting to a positive bus of a power distribution system. The isolation measurement circuit also includes a second switch connecting a second isolation resistor to the terminal of the measurement resistor, the second isolation resistor also connecting to a negative bus of the power distribution system. The isolation measurement circuit also includes a pulse generator that connects the measurement resistor to chassis ground.

21 Claims, 8 Drawing Sheets

INTEGRATED ACTIVE ISOLATION MEASUREMENT

TECHNICAL FIELD

The disclosure relates measuring parameters for high voltage battery systems.

BACKGROUND

This disclosure relates to high voltage isolation measurement for high voltage power distribution systems. High voltage isolation may be used in a wide variety of circuits and devices, such as high voltage DC power distribution circuits. High voltage isolation may include high resistance resistors, such as power resistors, between a positive bus and ground and/or a negative bus and ground.

High voltage isolation is often used where electrical safety is a concern. For example, high voltage isolation may be used in electric vehicles, self-driving vehicles, or other settings where an electrical short or electrical failure can result in safety concerns.

SUMMARY

In general, the disclosure describes active isolation measurement techniques to verify isolation resistance between a high voltage power distribution system and a reference, such as ground. For an electric vehicle, the high voltage power distribution should be fully isolated from the vehicle chassis, e.g., the reference. The isolation resistance should be measured periodically over the lifetime of the electric vehicle, or over the lifetimes of other systems with a high voltage power distribution system, to ensure no fault has occurred that may affect electrical isolation protecting the user, mechanic, or others that may touch the electric vehicle, from an unwanted electrical shock.

The active isolation measurement techniques may be used without a high voltage present, and therefore may be used on either side of relays that control provision of the high voltage to the loads of the HV distribution system. For example, an active isolation measurement system may be used between the high voltage (HV) battery and the HV relays, or between the HV relays and the loads supplied by the HV battery. The active isolation measurement may comprise circuitry that may include any or all of an isolation measurement circuit, an isolation island, and signal conditioning to change the measurement to a signal that may be received by processing circuitry configured to determine, and control, further action as needed.

In one example, this disclosure describes an isolation measurement circuit including: a first switch connecting a first isolation resistor to a terminal of a measurement resistor, wherein the first isolation resistor also connects to a positive bus of a power distribution system; a second switch connecting a second isolation resistor to the terminal of the measurement resistor, wherein the second isolation resistor also connects to a negative bus of the power distribution system; and a pulse generator that connects the measurement resistor to chassis ground.

In another example, this disclosure describes a power distribution system including: a power supply configured to supply a load with power, wherein the power supply and load are isolated from a chassis ground for the power distribution system; an isolation measurement circuit includes a first switch connecting a first isolation resistor to a first terminal of a measurement resistor, wherein the first isolation resistor also connects to a positive bus of a power distribution system; a second switch connecting a second isolation resistor to a second terminal of the measurement resistor, wherein the second isolation resistor also connects to a negative bus of the power distribution system; and; a pulse generator that connects the measurement resistor to the chassis ground.

In another example, this disclosure describes a method including: controlling a switch to connect a bus of a power distribution system to a first terminal of a measurement resistor, wherein the bus connects to the first terminal of the measurement resistor through an isolation resistor; applying, by a pulse generator of an isolation measurement circuit, a pulse between a chassis ground and a second terminal of the measurement resistor, measuring a value across the measurement resistor, wherein the value measured across the measurement resistor comprises an indication of an isolation resistance between a chassis ground and the bus when the switch is conducting and the pulse generator delivers the pulse.

Details of these and other examples are set forth in the accompanying drawings and the description below. Other features, objects, and advantages will be apparent from the description and drawings, and from the claims.

DETAILED DESCRIPTION

This disclosure is directed to active isolation measurement techniques to verify isolation resistance between a high voltage power distribution system and a reference, such as ground. Road vehicles with a high voltage (HV) system may have a dedicated isolation resistance to operate safely. Government regulation or industry standards may require certain resistance levels and Y-capacitance levels for electric or hybrid vehicles. For example, according to the ISO 6469-3, road vehicles with a high voltage (HV) system should have dedicated isolation resistance of at least 100 Ohm/V or 500 Ohm/V when there is no specific protection in the AC environment, such as an inverter. Furthermore, according to the ISO 17409, a maximum Y-capacitance between the fully floating HV power distribution network and vehicle chassis should not exceed 4 microfarads (uF) at 400 V or 2 uF at 800 V. To ensure safe operation, these values should be monitored within the vehicle. Currently, passive isolation networks are used, in which require that high voltage is present within the system.

In accordance with the techniques and devices disclosed herein, an isolation measurement circuit includes switches (e.g., transistors formed in semiconductor materials) that connect isolation resistors between the positive and negative high voltage buses of the power distribution system and a measurement system including a measurement resistor and a pulse generator connecting the measurement resistor to a reference, e.g., ground, or a chassis ground of a vehicle. The isolation measurement circuit is an active isolation measurement circuit that is configured to measure the resistance and/or isolation of the power distribution system (e.g., the resistance of the isolation resistors or a voltage proportional to the resistance of the isolation resistors) without the presence of the high voltage source, e.g., whether the high voltage source is connected to a load or disconnected from the load.

The devices and techniques described herein provide a number of advantages. For example, the devices and techniques disclosed herein provide improved protection of the measurement components by not requiring a high voltage to be present, e.g., if the isolation resistors fail, the high voltage may wear or degrade electrical components of the measurement system. Also, the devices and techniques disclosed herein provide improved monitoring of the isolation of the high voltage system by increasing the amount of time when a measurement may be performed, which may catch a decreasing resistance trend of the isolation resistors more quickly. Further, the devices and techniques may provide improved longevity of components of the high voltage distribution system, for example, by not requiring relatively large relays to open or close in order to obtain a measurement, saving on wear and tear on the relays which may need to be replaced after relatively few open/close cycles (e.g., less than ten open/close cycles).

Figure 1:
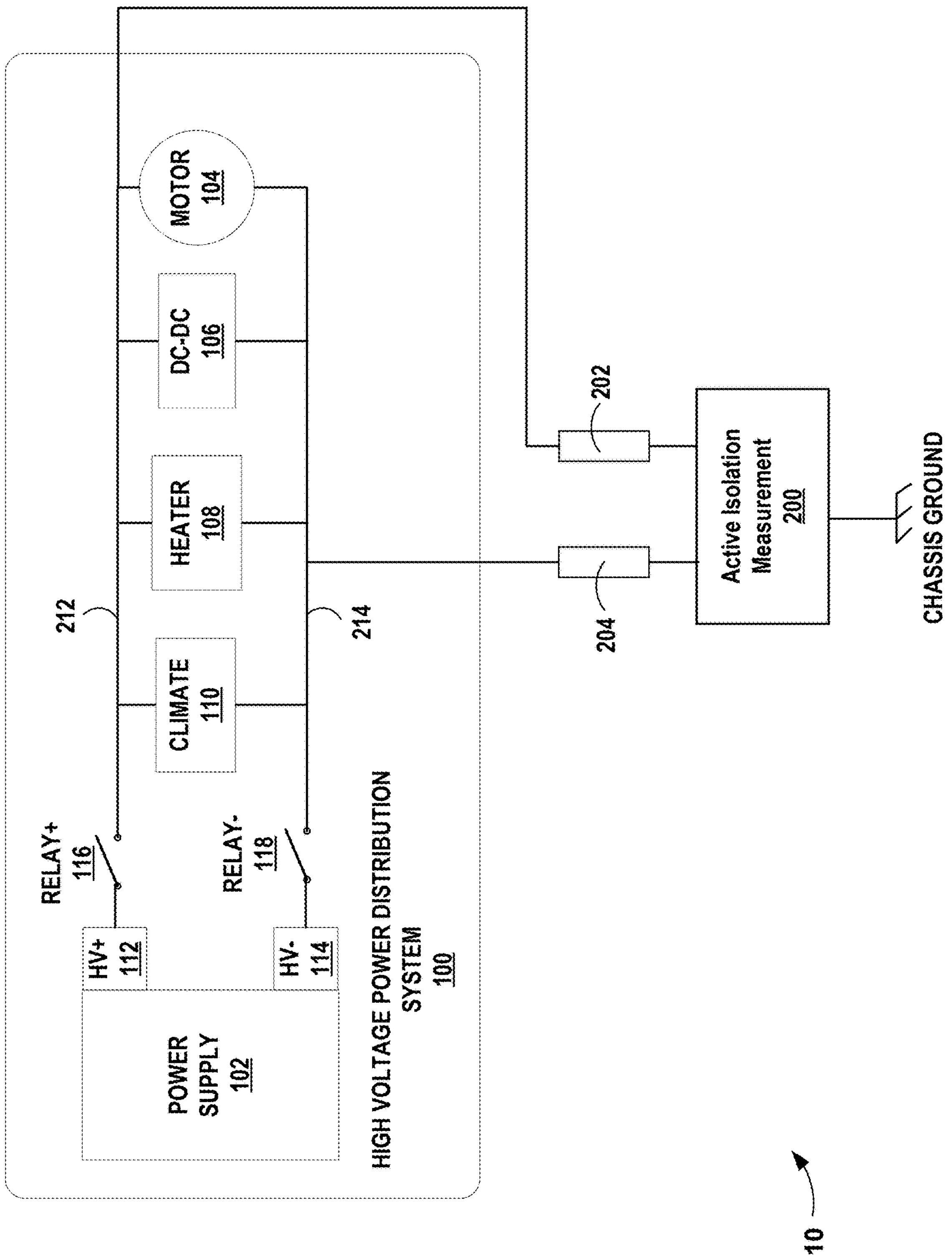
FIG. 1 is a block diagram illustrating an example power distribution system.

FIG. 1 is a block diagram illustrating an example isolation system 10 including a HV power distribution system 100 and an active isolation measurement circuit 200.

Although described herein as being a part of an electric vehicle, isolation system 10 represents any electrical system including a HV power distribution system 100. In the example shown, isolation system 10 also includes isolation resistors 202 and 204, and chassis ground 120.

In the example shown, HV power distribution system 100 includes power supply 102, electrical loads 104-110, positive HV terminal 112 and negative HV terminal 114, relays 116 and 118, and positive HV bus 212 and negative HV bus 214. Power supply 102 is electrically connected to electrical loads 104-110 via electrical relays 116, 118 and positive and negative HV buses 212, 214, and is configured to provide the voltage for electrical loads 104-110 to draw electrical current from power supply 102. In the example shown, electrical loads 104-110 include a motor 104, a DC-DC converter, a heater 108, and a climate control system 110. In other examples, HV power distribution system 100 may include fewer or more electrical loads, e.g., one, two, three, 4 or 5 or more electrical loads. In the example shown, electrical loads 104-110 are connected in parallel, and in other examples, one or more of electrical loads 104-110 may be connected in series, or in any combination of series and/or parallel. Power supply 102 is configured to provide a relatively high voltage to positive and negative HV buses 212, 214, e.g., +/−400 V, +/−800 V, or any suitable positive or negative voltage.

Relay 116 is connected to positive HV terminal 112 and positive HV bus 212, and relay 118 is connected to negative HV terminal 114 and negative bus HV 214. Relays 116, 118 are configured to connect and disconnect power supply 102 from loads 104-110, e.g., in case of a short, an overload or overcurrent. Relays 116, 118 may comprise electromechanical devices configured to switch high voltage signals. In some examples, relays 116, 118 may comprise semiconductor-based relay devices such as power MOSFETs (metal oxide semiconductor field effect transistors). Relays 116, 118 may be configured to be substantially robust to switching high voltages, high currents, and or high signal frequencies, e.g., for a plurality of open and close cycles. In some examples, relays 116, 118 are robust and also configured to be replaced after a relatively low number of open/close cycles, e.g., about 5 open/close cycles, or about 10 open/close cycles, such that it may be desirable not to have to open/close relays 116, 118 in order to obtain a measurement of the resistance and/or health of isolation resistors 202, 204.

Isolation resistors 202 and 204 are connected between the HV power distribution system 100 and chassis ground 120, and are configured to isolate HV power distribution system, e.g., from surfaces a user may come into contact with. In the example shown, first isolation resistor 202 is connected to positive HV bus 212, and is also connected to chassis ground 120 via active isolation measurement circuit 200, and second isolation resistor 204 is connected to negative HV bus 214, and is also connected to chassis ground 120 via active isolation measurement circuit 200. Isolation resistors 202, 204 may each represent and isolation resistance between the positive and negative buses, respectively, and chassis ground, and may comprise one or more electrical components, e.g., any combination of resistors, power resistors, or the like. Isolation resistors 202, 204 may degrade over time or after dissipating relatively large currents. In some examples, isolation resistors 202, 204 may be representative of a plurality of electrical components rather than single resistors, e.g., representing isolation resistances of an electrical path between the positive bus 212 and negative bus 214 HV power distribution system 100 and chassis ground 120.

Active isolation measurement circuit 200 is connected between each of isolation resistors 202, 204, and chassis ground, and is configured to measure the isolation resistance of each of isolation resistors 202, 204, and in some examples, to measure the Y-capacitance of each of the positive and negative HV buses 212, 214 (e.g., between each bus and chassis ground 120) and/or the X-capacitance between positive and negative HV buses 212, 214. Active isolation measurement circuit 200 may be configured to inject a pulse and/or signal via a pulse generator and to measure the resulting voltage drop over a measurement resistor, as further described below.

Figure 2:
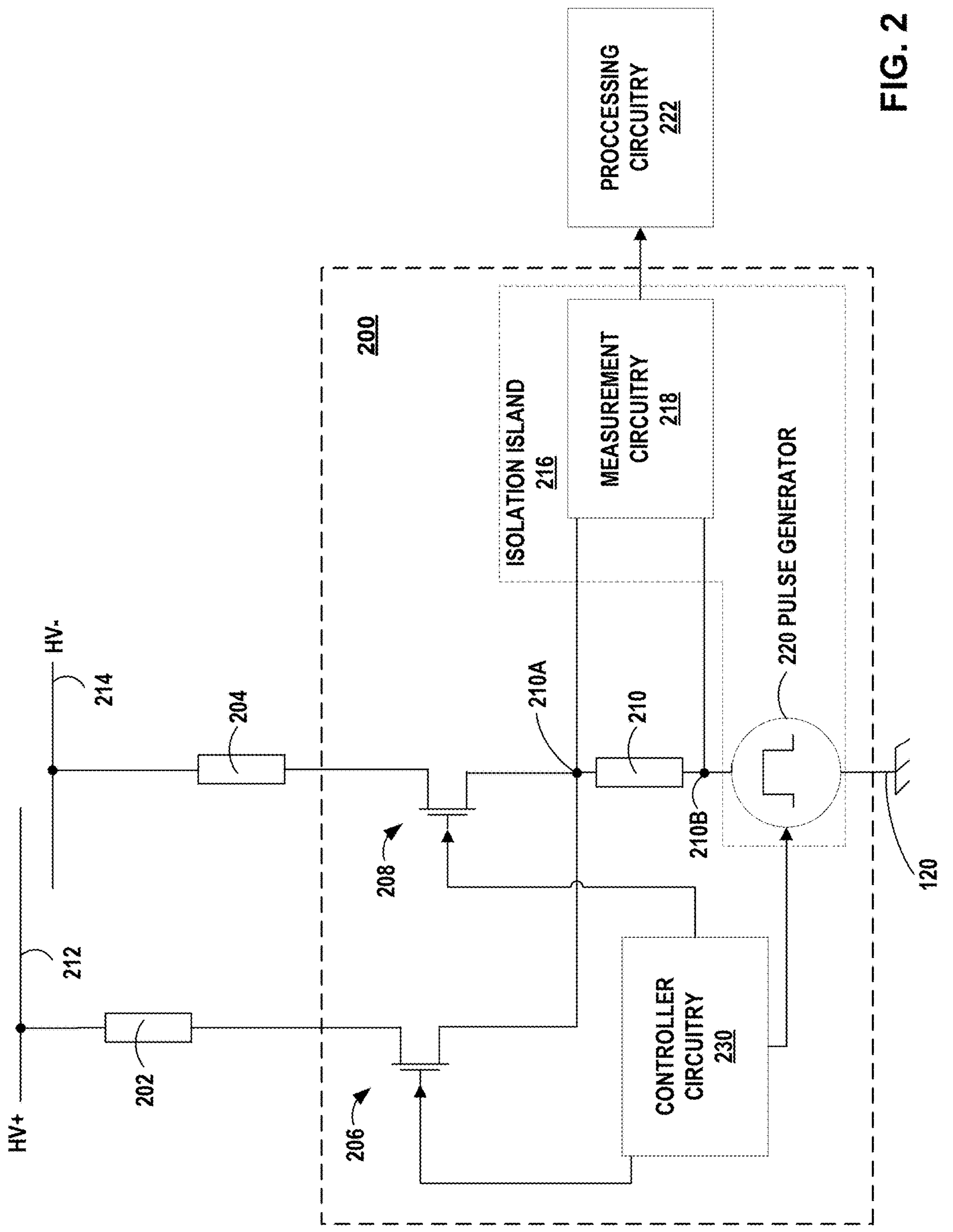
FIG. 2 is a schematic and block diagram illustrating an example active isolation measurement circuit.

FIG. 2 is a schematic and block diagram illustrating example active isolation measurement circuit 200. In the example shown, active isolation measurement circuit 200 includes switches 206, 208, controller circuitry 230, measurement resistor 210, and isolation island 216. Isolation island 216 includes pulse generator 220 and signal and measurement circuitry 218. In the example shown, active isolation measurement circuit 200 is connected between both isolation resistor 202 and chassis ground 120 and isolation resistor 204 and chassis ground 120, and is communicatively coupled to processing circuitry 222.

In the example shown, first switch 206 connects isolation resistor 202 to terminal 210A of measurement resistor 210, and second switch 208 connects isolation resistor 204 to terminal 210A of measurement resistor 210. First and second switches 206, 208 may be relatively small switches, e.g., low voltage switches, because isolation resistors 202, 204 may be HV resistors and switches 206, 208 are connected on the lower voltage, lower current isolated side of isolation resistors 202, 204. In some examples, switches 206, 208 may be transistors, e.g., low or medium voltage MOSFETs. In other examples, switches 206, 208 may be any suitable switches, e.g., high, medium, or low voltage switches.

Pulse generator 220 connects the measurement resistor 210 to chassis ground, e.g., between terminal 210B of measurement resistor 210 and chassis ground. Pulse generator 220 is configured to generate and/or apply an electrical pulse (e.g., a voltage and/or current pulse having pulse characteristics including a pulse width, a pulse frequency, a pulse amplitude, and a timing or timing delay) between cassis ground 120 and the second terminal 210B of measurement resistor 210.

Controller circuitry 230 is configured to control the opening/closing of switches 206, 208 and the operation of pulse generator 220. Controller circuitry is connected to the gates of switches 206, 208, and is communicatively connected to pulse generator 220. In some examples, controller circuitry 230 may optionally be communicatively coupled to processing circuitry 222 and/or control circuitry of a battery management system. For example, processing circuitry 222 may determine when isolation resistance measurements are made, and the parameters of the measurements (e.g., pulse characteristics and the timing for when switches 206, 208 are opened and closed), and communicate the isolation measurement timing and parameters to controller 230, which then controls switches 206, 208 and pulse generator 220 to execute the isolation measurements according to the parameters.

Measurement resistor 210 is connected between pulse generator 220 and each of switches 206, 208. Measurement resistor 210 may be any suitable resistor and/or electrical component configured to cause a voltage drop across the resistor, e.g., to be measured by measurement circuit 218. For example, measurement resistor 210 may be a carbon composition resistor, a carbon pile resistor, a printed carbon resistor, a thick or thin film resistor, an axial-leaded resistor, a metal film resistor, a metal oxide resistor, a wire wound resistor, a metal foil resistor, an adjustable resistor, a potentiometer, or any suitable resistor.

Measurement circuit 218 is connected across measurement resistor 210, e.g., to terminals 210A and 210B. Terminals 210A and 210B may be measurement nodes of measurement resistor 210. Measurement circuit 218 is configured to measure a voltage drop across measurement resistor 210 and/or an electrical current through measurement resistor 210. In some examples, measurement circuit 218 comprises a voltmeter, and/or an ammeter, or any suitable electrical component configured to measure voltage and/or current. In some examples, measurement circuit 218 may comprise a differential amplifier. For example, measurement circuit 218 may measure a negative voltage drop across measurement resistor 210. Processing circuitry 222 may not tolerate negative voltages, and a differential amplifier of measurement circuit 218 may be configured to condition the measured voltage, e.g., convert the measured negative voltage into a positive voltage and to amplify the voltage to increase or decrease the voltage to be in a range useable by processing circuitry 222. In some examples, a succession two diodes may be used to feed only a single signal towards processing circuitry 222, e.g., a monitoring device, a battery management system (BMS) microcontroller, or the like. In some examples, measurement circuit 218 measures a voltage signal, e.g., a voltage drop signal as a function of time, and may condition the signal and provide the conditioned signal to processing circuitry 222. In some examples, measurement circuit 222 may include memory, and may be configured to store one or more voltage measurements, one or more voltage signal measurements, and/or one or more values derived from voltage or voltage signal measurements, e.g., one or more isolation resistances of isolation resistors 206, 208.

Processing circuitry 222 is communicatively coupled with measurement circuitry 218 and is configured to receive measurements, e.g., voltages, voltage signals, currents, current signals, or quantities derived therefrom, e.g., resistances and/or measurement and signal conditioning parameters from measurement circuitry 218. Processing circuitry 222 may also be communicatively coupled to controller circuitry 230 and may be configured to provide switch and pulse generation parameters to controller circuitry 230, and measurement timing to both measurement circuitry 218 and controller circuitry 230.

In the example shown, pulse generator 220 and measurement circuitry 218 are included within isolation island 216. Isolation island 216, and electrical components within isolation island 216, may be galvanically isolated from voltages and currents within active isolation measurement circuit 200. For example, pulse generator 220 and measurement circuitry 218 may be relatively low voltage circuitry and/or components, e.g., 12 V, 24 V, or the like. In some examples, isolation island 216 may comprise a coreless transformer, e.g., electrical components such as pulse generator 220 and measurement circuitry 218 may be electrically connected to, but galvanically isolated from, the rest of active isolation measurement circuit 200, e.g., switches 206, 208, measurement resistor 210, chassis ground 120, and electrical wires, lines, or traces coupling switches 206, 208, measurement resistor 210, and chassis ground 120. In some examples, isolation island 216 comprises a first coreless transformer coupling pulse generator 220 and measurement circuitry 218 to the rest of active isolation measurement circuitry 200, e.g., coupling pulse generator to controller circuitry 230, measurement resistor terminal 210A, and chassis ground 120, and coupling measurement circuitry to terminals 210A and 210B of measurement resistor 210. Isolation island 216 may then also comprise a second coreless transformer coupling active isolation measurement circuit 200 with processing circuitry 222, e.g., coupling measurement 218 and processing circuitry 222.

Active isolation measurement circuit 200 may be configured to determine values from which whether there is an isolation ground failure, e.g., by processing circuitry 222. For example, controller circuitry 230 may be configured to open switch 208 to disconnect measurement resistor 210 from isolation resistor 204 and close switch 206 to connect measurement resistor 210 and isolation resistor 202 (e.g., such that switch 206 is substantially conducting) to measure a value indicative of the isolation resistance between chassis ground 120 and positive HV bus 212. In some examples, the value may be a voltage drop across measurement resistor 210. For example, with switch 208 open and switch 206 closed, pulse generator 220 may apply a pulse between chassis ground 120 and terminal 210B of measurement resistor 210. If isolation resistor 202 is robust and has a substantially high resistance, e.g., an isolation resistance, then the voltage drop across measurement resistor 210 for the pulse will be very low. If isolation resistor 202 is degraded and has a resistance less than a threshold, e.g., 100 Ohm/V or 500 Ohm/V, then an amount of current may flow through measurement resistor 210 and the voltage drop across measurement resistor 210 for the pulse may be relatively larger, e.g., larger than a predetermined voltage drop. Measurement circuitry 218 may measure the resulting voltage drop across measurement resistor 210 for the pulse, which may be a value indicative of the isolation resistance between chassis ground 120 and the positive HV bus 212 provided by isolation resistor 202.

Controller circuitry 230 may be configured to close switch 208 to connect measurement resistor 210 and isolation resistor 204 and open switch 206 to disconnect measurement resistor 210 from isolation resistor 202 to measure a value indicative of the isolation resistance between chassis ground 120 and negative HV bus 214. In some examples, the value may be a voltage drop across measurement resistor 210. For example, with switch 204 closed and switch 202 open, pulse generator 220 may apply a pulse between chassis ground 120 and terminal 210B of measurement resistor 210. If isolation resistor 204 is robust and has a substantially high resistance, e.g., an isolation resistance, then the voltage drop across measurement resistor 210 for the pulse will be very low. If isolation resistor 204 is degraded and has a resistance less than a threshold, e.g., 100 Ohm/V or 500 Ohm/V, then an amount of current may flow through measurement resistor 210 and the voltage drop across measurement resistor 210 for the pulse may be relatively larger, e.g., larger than a predetermined voltage drop. Measurement circuitry 218 may measure the resulting voltage drop across measurement resistor 210 for the pulse, which may be a value indicative of the isolation resistance between chassis ground 120 and the negative HV bus 24 provided by isolation resistor 204.

In some examples, active isolation measurement circuit 200 is configured to determine and store initial values indicative of the isolation resistance for isolation resistors 202, 204, e.g., at an initial time such as the initial time HV power distribution system 100 is used, an initial time active isolation measurement circuit 200 is used, or at some other time, e.g., at which the isolation resistance of isolation resistors 202, 204 is known and/or is known to provide isolation for HV power distribution system 100, or periodically, e.g., annually, monthly, weekly, daily, or at any other time. Active isolation measurement circuit 200 may then be configured to determine an isolation resistance and/or whether an isolation ground failure exists by comparing current measurement values to the initial values. For example, active isolation measurement circuit 200 may take repeated values measured across measurement resistor 210 over time, for comparison by active isolation measurement circuit 200 and/or processing circuitry 222 with the initial measurement values.

In other examples, active isolation measurement circuit 200 may be configured to determine an isolation resistance and/or whether an isolation ground failure exists by comparing current measurement values to a threshold value, e.g., a threshold voltage drop across measurement resistor 210. For example, active isolation measurement circuit 200 may take repeated values measured across measurement resistor 210 over time, for comparison by active isolation measurement circuit 200 and/or processing circuitry 222 with a threshold value. In other examples, active isolation measurement circuit 200 may be configured to determine an isolation resistance and/or whether an isolation ground failure exists by comparing measurement values over time, e.g., comparing against previous measurement values. For example, active isolation measurement circuit 200 may take repeated values measured across measurement resistor 210 over time. Active isolation measurement system 200, or processing circuitry 222, may then determine a trend that may be indicative of if, and/or when, the isolation resistance of one or both of isolation resistors 202, 204 is, or will be, less than a threshold isolation resistance, or whether a measured value deviates by a threshold amount relative to the repeated value measurements, e.g., one or more previously measured values.

In some examples, active isolation measurement circuit 200 may include a capacitance measurement circuit configured to measure a capacitance, or configured to cause a capacitance to be measurable, between chassis ground and positive HV bus 212, or between chassis ground 120 and negative HV bus 214, e.g., Y-capacitances, or between positive HV bus 212 and negative HV bus 214, e.g., an X-capacitance. For example, active isolation measurement circuit 200 may include an RC circuit (not shown in FIG. 2) connected across measurement resistor 210, e.g., connected to terminals 210A and 210B. A pulse from pulse generator 220 may be measured across measurement resistor 210 by measurement circuit 218 with a changed pulse shape, e.g., having a rise time and a fall time associated with charging the capacitor of the RC circuit. In some examples, the RC circuit may have known resistance and capacitance values, and the rise time and/or fall time of the measured value, e.g., voltage signal due to a pulse from pulse generator 220, may be different by being affected by the capacitance between positive HV bus 212 and chassis ground 120 when switch 204 is open and switch 202 is closed, or a capacitance between negative HV bus 214 and chassis ground 120 when switch 202 is open and switch 204 is closed, or a capacitance between positive HV bus 212 and negative HV bus 214 when both switches 202 and 204 are closed. In other examples, active isolation measurement circuit 200 may not include separate components forming an RC circuit, and active isolation measurement circuit 200 may include an intrinsic RC circuit via its resistance and the capacitance between the positive/negative buses 212, 214 and chassis ground or each other, e.g., the measured rise time and/or fall time of the measured value may be indicative (e.g., directly indicative) of a capacitance between positive HV bus 212 and chassis ground 120 when switch 204 is open and switch 202 is closed, or a capacitance between negative HV bus 214 and chassis ground 120 when switch 202 is open and switch 204 is closed, or a capacitance between positive HV bus 212 and negative HV bus 214 when both switches 202 and 204 are closed.

Figure 3:
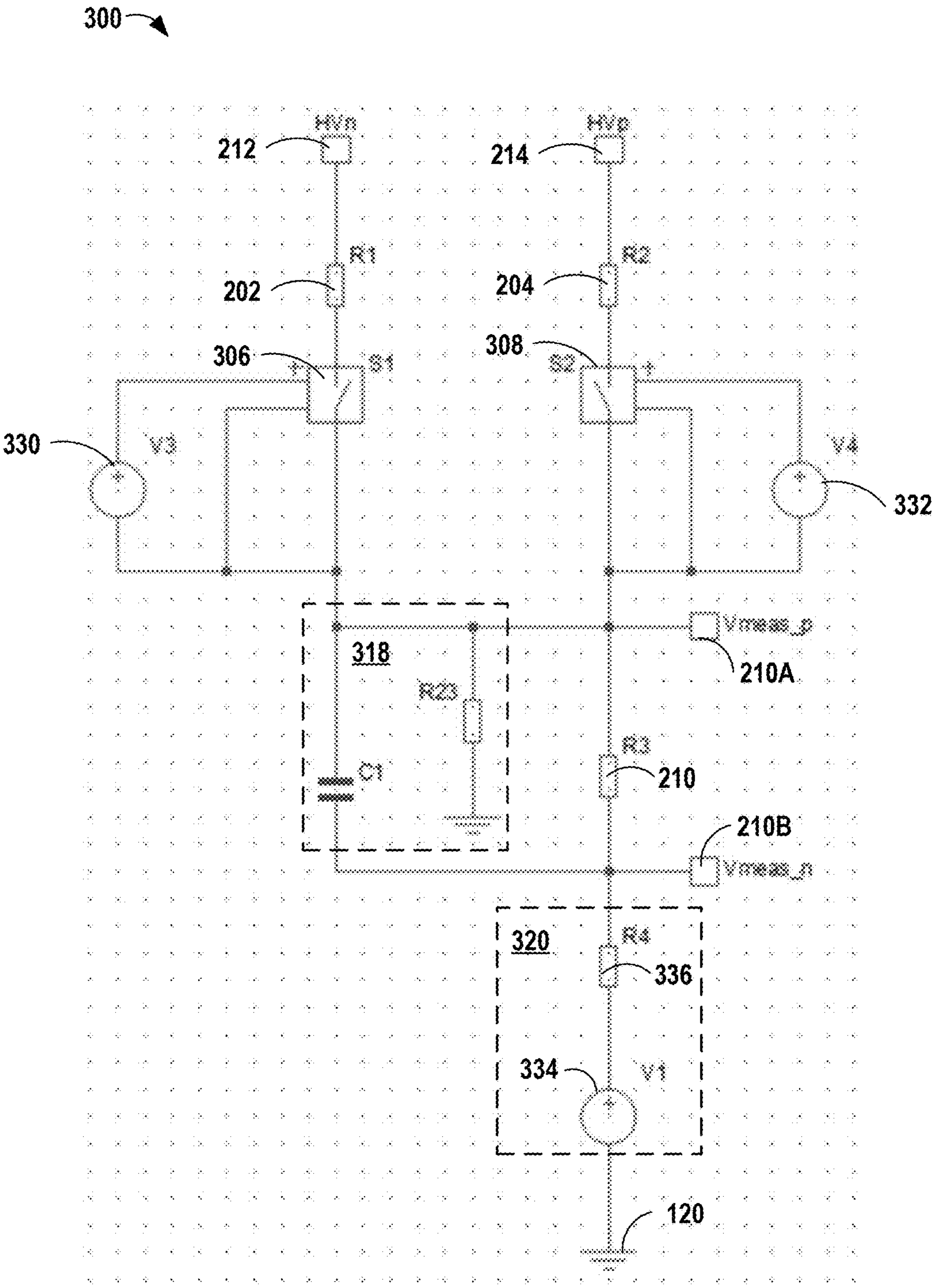
FIG. 3 is a schematic circuit diagram illustrating an example active isolation measurement circuit.

FIG. 3 is a schematic circuit diagram illustrating an example active isolation measurement circuit 300. In the example shown, active isolation measurement circuit 300 includes switches 306, 308, voltage drivers 330, 332, measurement resistor 210, pulse generator 320, and RC circuit 318. In the example shown, active isolation measurement circuit 300 is connected between both isolation resistor 202 and chassis ground 120 and isolation resistor 204 and chassis ground 120, and terminals 210A and 210B which maybe nodes at which measurement circuitry 218 (FIG. 2) may be connected to measure a voltage or voltage signal across measurement resistor 210, e.g., connected at terminals 210A, 210B.

Switches 306, 308 may be substantially similar to switches 206, 208 described above, and voltage drivers 330, 332 may be representative of a portion of controller circuitry 230 (FIG. 2) configured to control the opening and closing of switches 306, 308, e.g., a voltage applied to the gates of switches 306, 308. Pulse generator 320 may be substantially similar to pulse generator 220 and may include voltage driver 334 and resistor 336. Voltage driver 334 and resistor 336 may be representative of a portion of pulse generator 320 configured to provide a pulse to terminal 210B.

In the example shown, pulse generator 320 is configured to provide an impulse to a high voltage network at the positive and negative buses 212, 214. Switches 306, 308 may be triggered such that both switches 306, 308 are connecting measurement resistor 210 and chassis ground 120 to buses 212, 214 through isolation resistors 202, 204, or only a single switch 306 or 308 is connecting measurement resistor 210 and chassis ground 120 to bus 212 or 214 through isolation resistor 202 or 204, respectively. For a simultaneous drop in the isolation resistance of both isolation resistor 202 or 204, only one of switches 306 or 308 may be closed/connected. When a pulse is triggered/generated by voltage driver 334 of pulse generator 320, the response of the system may be measured at measurement resistor 210 at the terminals/nodes 210A, 210B.

The differential voltage at terminals 210A, 210B (e.g., the voltage drop across measurement resistor 210) of active isolation measurement circuit 200 or active isolation measurement circuit 300 may be negative. Processing circuitry, e.g., processing circuitry 222 (FIG. 2), may be configured to receive positive voltages, and measurement circuitry 218 may include a differential amplifier (FIG. 5) may be configured to convert a measured negative voltage to a positive voltage. Additionally, measurement circuitry 218 may be configured to filter (e.g., low pass filter) and provide a single measurement value and/or measurement value signal to processing circuitry 222, which may be configured to store the conditioned, measured value and/or signal, e.g., within memory. Subsequent measurements may then be compared to stored measurements, and processing circuitry 222 may cause a system response (e.g., to remove a high voltage from the positive and negative buses 212, 214 and output instructions to a user interface) based on deviations of a current measurement from the stored measurements which are not within an expected tolerance (e.g., within an expected value range or above or below a threshold value). In some examples, processing circuitry 222 may determine an isolation resistance value based on the gain of the differential amplifier.

Figure 4:
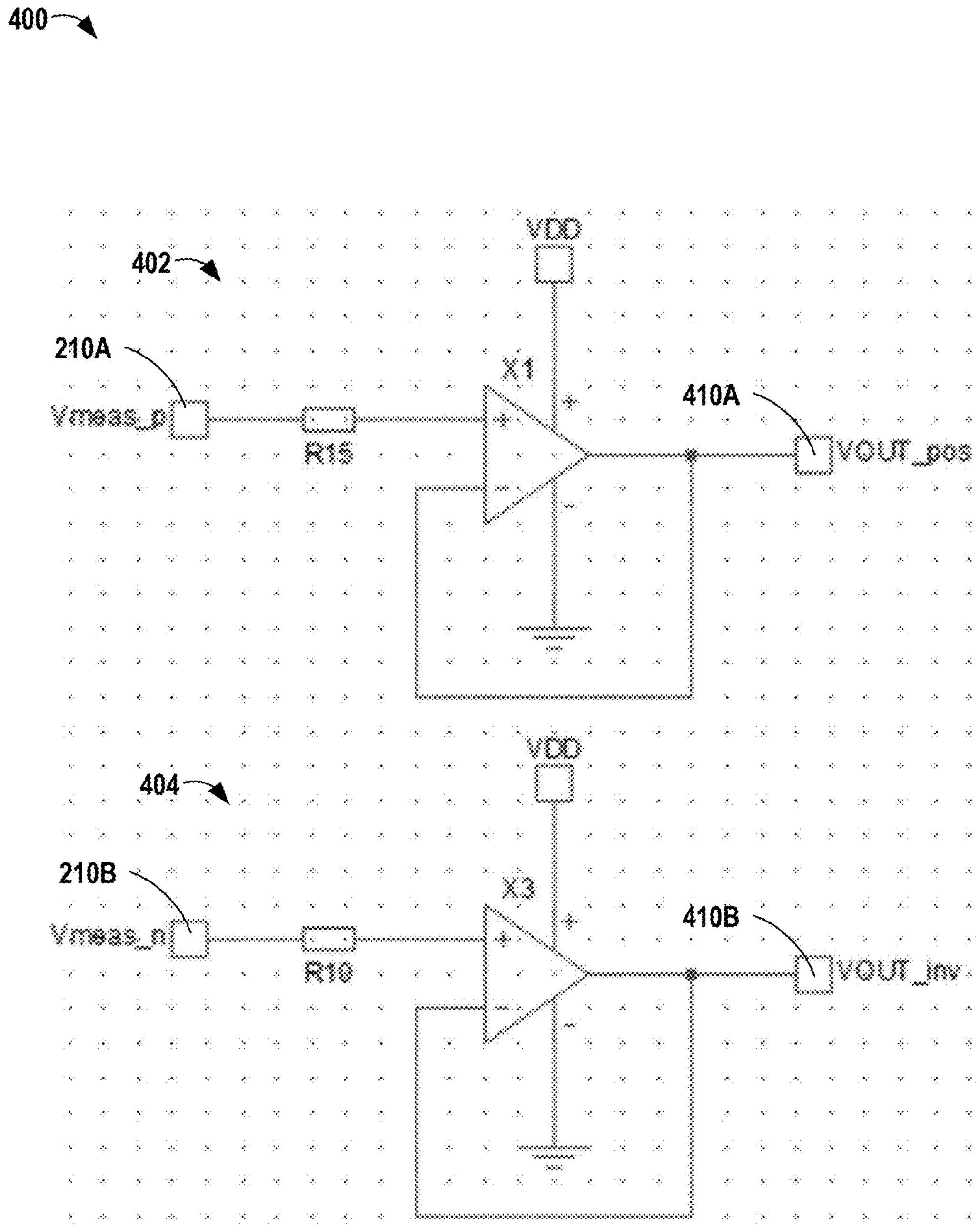
FIG. 4 is a schematic diagram illustrating an example voltage follower for the signal conditioning circuit.
Figure 5:
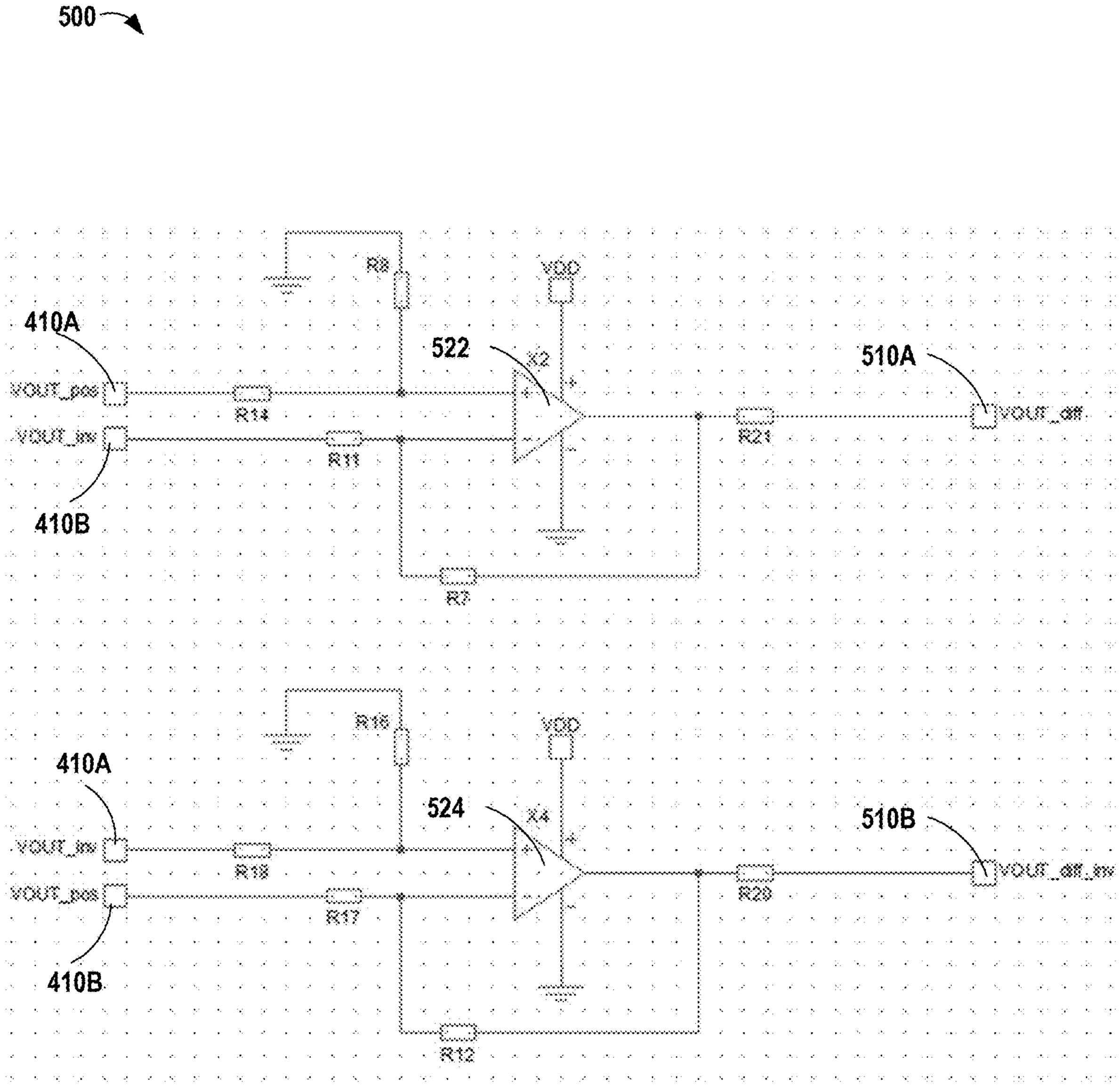
FIG. 5 is a schematic diagram illustrating an example differential amplifier for the signal conditioning circuit.
Figure 6:
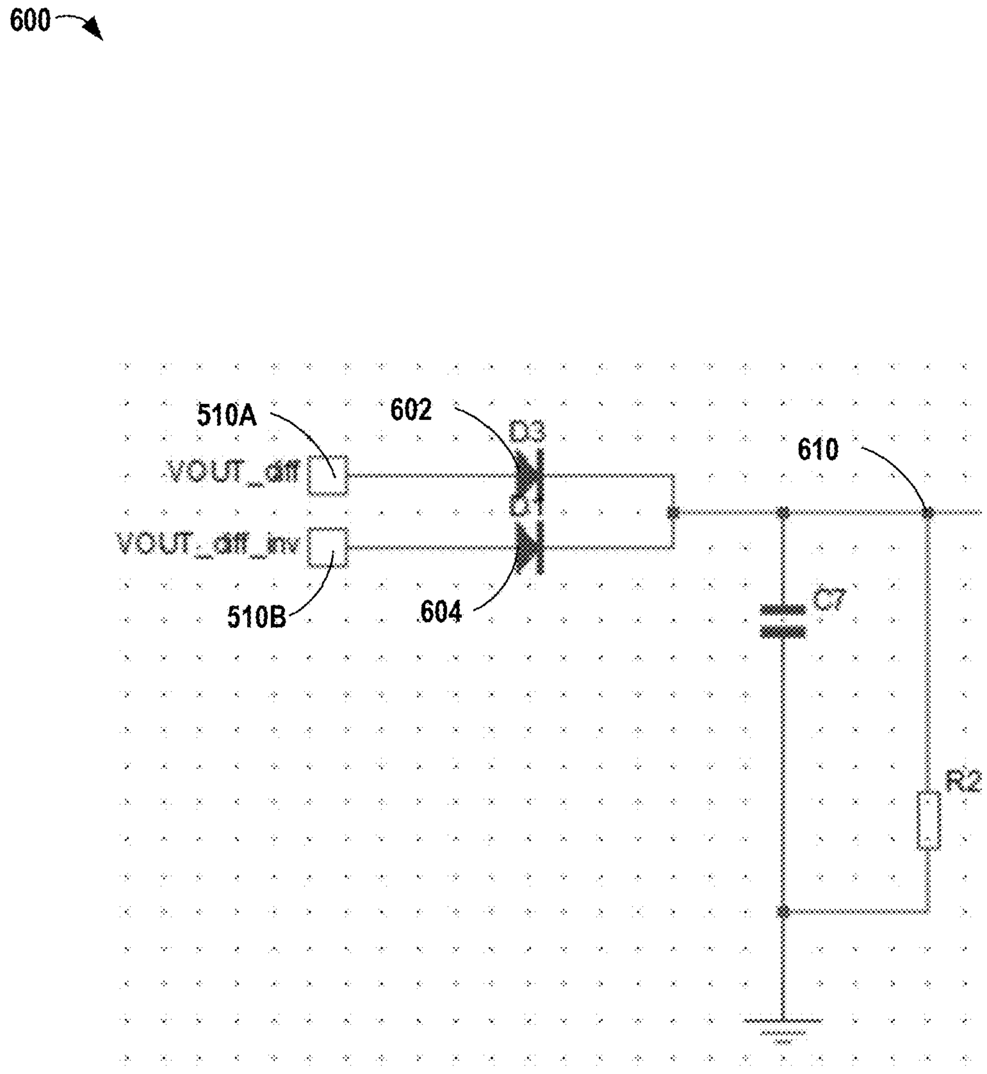
FIG. 6 is a schematic diagram illustrating an example circuit to provide a signal for evaluation by a processing circuitry.

FIGS. 4-6 are schematic diagrams illustrating circuits that may be used to condition a signal measured by active isolation measurement circuit 300 (e.g., circuits that measurement circuitry 218 (FIG. 2) may include) or by active isolation measurement circuit 300. FIG. 4 is a schematic diagram illustrating an example voltage follower circuit 400, FIG. 5 is a schematic diagram illustrating an example differential amplifier circuit 500, and FIG. 6 is a schematic diagram illustrating an example single output circuit 600.

Referring to FIG. 4, voltage follower circuit 400 includes a first voltage follower 402 configured to be connected to terminal 210A (e.g., the high voltage side of measurement resistor 210) and a second voltage follower 404 configured to be connected to terminal 210B (e.g., the low voltage side of measurement resistor 210). Voltage follower circuit 400 may be configured to operate as a buffer for the measured values and to provide a high impedance for providing the measured values and/or signal (e.g., voltages and/or voltage signal) to the relatively low impedance processing circuitry 222, e.g., via differential amplifier circuit 500 and single output circuit 600. In the example shown, first voltage follower 402 may be configured output positive a measured voltage at terminal 410A, and second voltage follower 404 may be configured output inverted measured voltage at terminal 410B.

Referring to FIG. 5, example differential amplifier circuit 500 includes a first operational amplifier 522 and a second operational amplifier 524. In the example shown, the noninverting input of operational amplifier 522 is configured to be connected to terminal 410A (e.g., to receive the positive measured voltage) and the inverting input of operational amplifier 522 is configured to connect to terminal 410B (e.g., to receive the inverted measured voltage). Additionally, the noninverting input of operational amplifier 524 is configured to be connected to terminal 410A (e.g., to receive the inverted measured voltage) and the inverting input of operational amplifier 524 is configured to connect to terminal 410B (e.g., to receive the positive measured voltage). In the example shown, operational amplifier 522 may be configured output positive differential voltage at terminal 510A, e.g., the voltage drop across measurement resistor 210 as a positive, noninverted value, and operational amplifier 524 may be configured output inverted differential voltage at terminal 510B, e.g., the voltage drop across measurement resistor 210 also as a positive value since the circuit inverts the inverted (e.g., negative) measured voltage. In some examples, differential amplifier circuit 500 is configured to output positive differential voltage at terminal 510A that is indicative of an isolation resistance and/or a capacitance between positive bus 212 and chassis ground 120 and/or a capacitance between positive bus 212 and negative bus 214, and differential amplifier circuit 500 is configured to output inverted differential voltage at terminal 510B (which may now be a positive value) that is indicative of an isolation resistance and/or a capacitance between negative bus 212 and chassis ground 120 and/or a capacitance between positive bus 212 and negative bus 214. For example, positive differential voltage may be indicative of the resistance and/or health of isolation resistor 202, and inverted differential voltage may be indicative of the resistance and/or health of isolation resistor 204.

Referring to FIG. 6, single output circuit 600 includes a first diode 602 configured to be connected to terminal 510A (e.g., to receive positive differential voltage as an input) and a second diode 604 configured to be connected to terminal 510B (e.g., to receive inverted differential voltage as an input). The outputs of diodes 602 and 604 may be connected, and diodes 602, 602 are configured to output positive differential voltage and/or inverted differential voltage to terminal 610, e.g., to which processing circuitry 222 may be connected. Whether positive differential voltage and/or inverted differential voltage is output to terminal 610 may depend on the timing of the opening and closing of switches 206, 208 (FIG. 2) or switches 306, 308 (FIG. 3). Single output circuit 600 may be configured to low pass filter positive differential voltage and/or inverted differential voltage, and may also be configured to convert positive differential voltage and/or inverted differential voltage to a digital signal, e.g., single output circuit 600 may also be configured to operate as an analog-to-digital converter.

Figure 7:
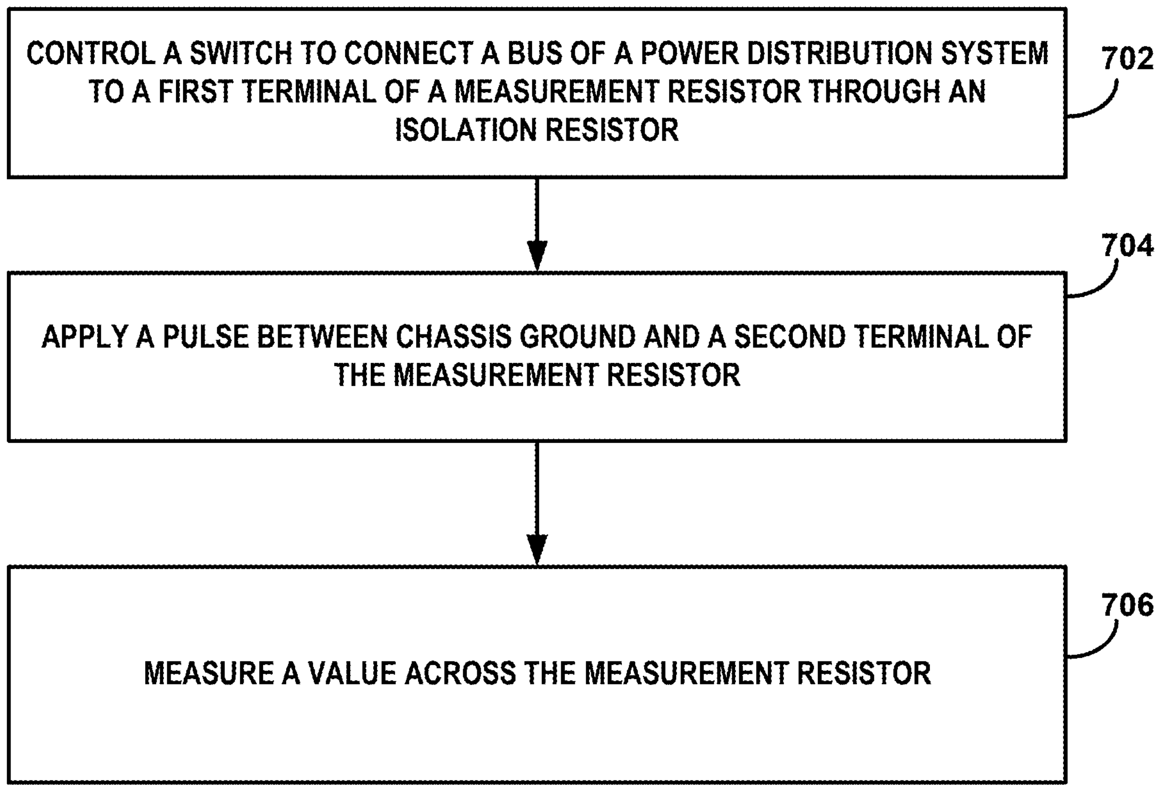
FIG. 7 is a flow diagram illustrating an example method of measuring an isolation resistance.
Figure 8:
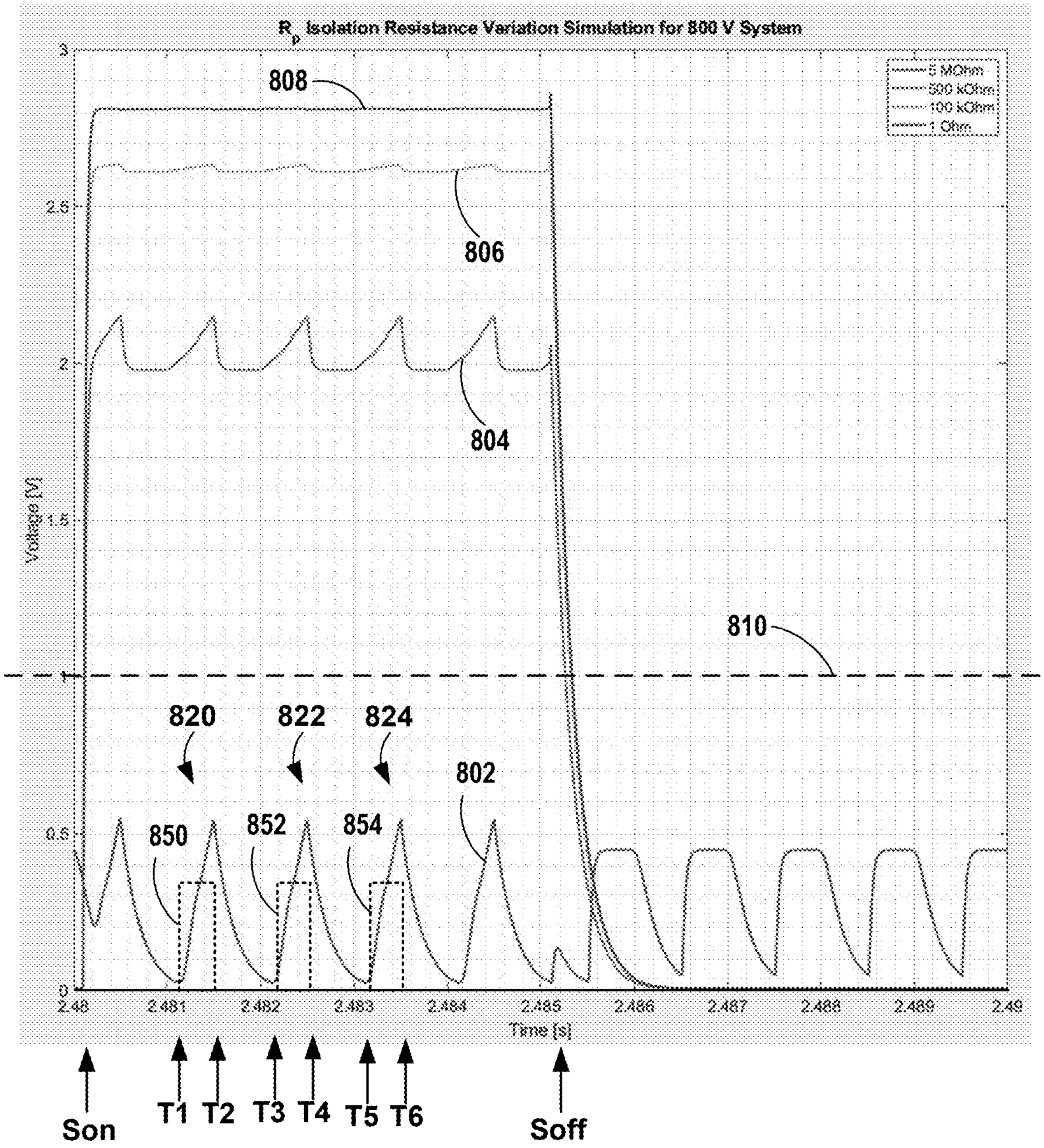
FIG. 8 is a plot of an example voltage signal as a function of time as measured by the example active isolation measurement circuit of FIG. 2 or FIG. 3.

FIG. 7 is a flow diagram illustrating an example method of measuring an isolation resistance. Although the example method of FIG. 7 is described with respect to active isolation measurement circuits 200 and 300 of FIGS. 1-3 and signal conditioning circuits 400, 500, and 600 of FIGS. 4-6, the example technique of FIG. 7 may be performed using any device including a pulse generator, switches, and a measurement resistor. FIG. 7 is described with reference to FIG. 8. FIG. 8 includes a plurality of plots 802-808 of example measured voltage signals as a function of time for a plurality of isolation resistor 202 resistance values as measured by the example active isolation measurement circuit of FIG. 2 or FIG. 3.

Processing circuitry 222 or controller circuitry 230 may control switch 202 to connect positive bus 212 of HV power distribution system 100 to a first terminal 210A of measurement resistor 210 (702). In some examples, processing circuitry 222 or controller circuitry 230 may, concurrently, control switch 204 to disconnect negative bus 212 from the first terminal 210A of measurement resistor 210.

In the example shown in FIG. 8, processing circuitry 222 or controller circuitry 230 control switch 202 to close (e.g., connect) at time Son at step (702), and to open (e.g., disconnect) at time Soff. In FIG. 8, each of plots 802-808 are a plot of a measured value or values, e.g., voltage signals, measured across measurement resistor 210 for a plurality of possible resistances of isolation resistor 202. In the example shown, HV power distribution system 100 may be an 800 V HV power distribution system 100. Plot 802 is the measured voltage signal for a 5 megaOhm isolation resistor 202, which may be a healthy, e.g., non-failing resistor. For example, for the 800 V HV power distribution system 100, the isolation resistance should be at least 80 kiloOhms to satisfy a 100 Ohm/V isolation resistance threshold, or at least 400 kiloOhms to satisfy a 500 Ohm/V isolation resistance threshold. Plot 804 is the measured voltage signal for a 500 kiloOhm isolation resistor 202, plot 806 is the measured voltage signal for a 100 kiloOhm isolation resistor 202, and plot 808 is the measured voltage signal for a 1 Ohm isolation resistor 202. Each of plots 804-808 may represent an inadequate, or failing, isolation resistor 202.

Pulse generator 220 may apply a pulse between chassis ground 120 and a second terminal 210B of measurement resistor 210 (704). For example, controller circuitry 230 may, concurrently with closing switch 202 and opening switch 204, cause pulse generator 230 to output one or more pulses and/or a pulsed signal. In the example shown in FIG. 8, pulse generator 220 applies pulses 850, 852, and 854 at times T1, T3, and T5 respectively, each having pulse widths of T2-T1, T4-T3, and T6-T5, respectively. In the example shown, pulses 850, 852, and 854 have the same pulse amplitudes (but which may not be on the same scale as the plot scale as shown and are just illustrative), but in other examples, pulses 850, 852, and 854 may have different amplitudes.

Measurement circuitry 218 may measure a value across measurement resistor 210 (706). For example, a voltmeter of measurement circuitry 218 may measure a voltage across measurement resistor 210 at a single point in time during a pulse from pulse generator 230, or may measure a plurality of voltages as a function of time, e.g., a voltage signal. The value(s) measured across the measurement resistor 210 may comprise an indication of an isolation resistance between chassis ground 120 and positive bus 212 when switch 202 is conducting (e.g., closed) and pulse generator 230 delivers the pulse. In the example shown in FIG. 8, measurement circuitry 218 may measure voltage signals corresponding to plots 802-808, each of which may indicate an isolation resistance, e.g., via the voltage level of the respective signals/plots. For example, plot 802 has a very low voltage, e.g., corresponding to the relatively low voltages of pulses 850, 852, and 854. In contrast, plots 804-808 have higher voltages, e.g., corresponding to the relatively low voltages of 850, 852, and 854 plus the additional DC voltage from positive bus 212 due to the inadequate isolation resistance of isolation resistor 202 for those respective plots.

In some examples, processing circuitry 222 or controller circuitry 230 may control switch 202 to disconnect positive bus 212 of HV power distribution system 100 from first terminal 210A of measurement resistor 210, and may control switch 204 to connect negative bus 214 of HV power distribution system 100 to the first terminal 210A of measurement resistor 210. Pulse generator 220 may apply a pulse between chassis ground 120 and the second terminal 210B of measurement resistor 210, e.g., concurrently with opening switch 202 and closing switch 204, cause pulse generator 230 to output one or more pulses and/or a pulsed signal. Measurement circuitry 218 may measure a second value across measurement resistor 210, e.g., a voltmeter of measurement circuitry 218 may measure a voltage across measurement resistor 210 at a single point in time during the pulse from pulse generator 230, or may measure a plurality of voltages as a function of time, e.g., a voltage signal, and the value(s) may comprise an indication of an isolation resistance between chassis ground 120 and negative bus 214 when switch 204 is conducting (e.g., closed) and pulse generator 230 delivers the pulse.

In some examples, processing circuitry 222 or measurement circuitry 218 may determine whether an isolation ground failure (e.g., isolation to ground failure) exists based on performing repeated value measurements across measurement resistor 210, and determining whether a previous measured value or signal deviates by a threshold amount relative to the repeated value or signal measurements. In the example shown in FIG. 8, processing circuitry 222 or measurement circuitry 218 may determine whether an isolation ground failure exists based on whether the measured voltage signals 802-808 are less than or equal to threshold voltage value 810. In other examples, plots similar to plots 802-808 may not be at a constant value over time, e.g., a plot may "float" up, or increase in voltage, e.g., if isolation resistor 202 begins to degrade. Rather than a global voltage threshold, processing circuitry 222 or measurement circuitry 218 may determine whether an isolation ground failure exists based on a subsequent voltage measurement or signal deviating from a previous voltage measurement or signal by a threshold amount.

In some examples, measurement circuitry 218 may receive the indication of the isolation resistance (e.g., the voltage and/or voltage signal) and conditioning the signal for use by other circuitry, e.g., processing circuitry 222. For example, measurement circuitry may buffer, differentially amplify, digitize, and/or output the signal over a single output terminal to processing circuitry 222.

In some examples, measurement circuitry 218 and/or processing circuitry 222 may determine a capacitance between positive bus 212 and chassis ground 120 (e.g., a first Y-capacitance), a capacitance between negative bus 214 and chassis ground 120 (e.g., a second Y-capacitance), or a capacitance between positive bus 212 and negative bus 214 (e.g., an X-capacitance), based on the measured value(s) and/or signal. In some examples, measurement circuitry 218 and/or processing circuitry 222 may determine a capacitance based on a rise time and/or a fall time of value (e.g., voltage) across measurement resistor 210.

In the example shown in FIG. 8, a Y-capacitance between positive bus 212 and chassis ground 120, and the resistances of active isolation measurement circuitry 200 or 300 may function as an RC circuit, altering (e.g., low pass filtering), the shape of the measured voltage signals relative to the shape of the pulses. In the example shown, pulses 850, 852, and 854 are substantially square-wave pulses, and plots 802-806 of the measured signals are substantially saw-tooth signal measured responses of active isolation measurement circuitry 200 or 300 to the input square-wave pulses (plot 808 of the measured signal for the 1 Ohm isolation resistance, however, is dominated by the high voltage DC from positive bus 212). For example, each of measured pulse responses 820, 822, and 824 of plot 802 have rise times between T1 and T2, T3 and T4, and T5 and T6, respectively, and fall times between T2 and T3, T4 and T5, and T6 and T7, respectively.

The rise and fall times of measured pulse responses 820, 822, and 824 (e.g., due to charging and discharging of the Y-capacitance) are characteristic of the RC circuit of the measurement system, and indicative of the Y-capacitance between positive bus 212 and chassis ground 120. Similarly, active isolation measurement circuitry 200 or 300 may measure voltage signals similar to plots 802-808 with switch 202 open and switch 204 closed to measure values indicative of the resistance of isolation resistor 204 and the Y-capacitance between negative bus 214 and chassis ground 120, and with both switches 202 and 204 closed to measure values indicative of an X-capacitance between positive bus 212 and negative bus 214.

The techniques described in this disclosure may be implemented, at least in part, in hardware, software, firmware or any combination thereof. For example, various aspects of the described techniques may be implemented within one or more processors or processing circuitry, including one or more micro-controllers (e.g., micro-controllers 102, 502, and/or 602), microprocessors, digital signal processors (DSPs), application specific integrated circuits (ASICs), field programmable gate arrays (FPGAs), or any other equivalent integrated or discrete logic circuitry, as well as any combinations of such components. The term "processor" or "processing circuitry" may generally refer to any of the foregoing logic circuitry, alone or in combination with other logic circuitry, or any other equivalent circuitry. A control unit including hardware may also perform one or more of the techniques of this disclosure.

Such hardware, software, and firmware may be implemented within the same device or within separate devices to support the various operations and functions described in this disclosure. In addition, any of the described units, circuits or components may be implemented together or separately as discrete but interoperable logic devices. Depiction of different features as circuits or units is intended to highlight different functional aspects and does not necessarily imply that such circuits or units must be realized by separate hardware or software components. Rather, functionality associated with one or more circuits or units may be performed by separate hardware or software components or integrated within common or separate hardware or software components.

The techniques described in this disclosure may also be embodied or encoded in a computer-readable medium, such as a computer-readable storage medium, containing instructions that may be described as non-transitory media. Instructions embedded or encoded in a computer-readable storage medium may cause a programmable processor, or other processor, to perform the method, e.g., when the instructions are executed. Computer readable storage media may include random access memory (RAM), read only memory (ROM), programmable read only memory (PROM), erasable programmable read only memory (EPROM), electronically erasable programmable read only memory (EEPROM), flash memory, a hard disk, a CD-ROM, a floppy disk, a cassette, magnetic media, optical media, or other computer readable media.

Various aspects of the techniques may enable the following examples.

Example 1: An isolation measurement circuit includes: a first switch connecting a first isolation resistor to a terminal of a measurement resistor, wherein the first isolation resistor also connects to a positive bus of a power distribution system; a second switch connecting a second isolation resistor to the terminal of the measurement resistor, wherein the second isolation resistor also connects to a negative bus of the power distribution system; and a pulse generator that connects the measurement resistor to chassis ground.

Example 2: The isolation measurement circuit of example 1, wherein the isolation measurement circuit is configured to determine a first value and a second value: wherein the first value is measured across the measurement resistor and comprises an indication of the isolation resistance between chassis ground and the positive bus when the first switch is conducting and the pulse generator delivers a pulse, wherein the second value is measured across the measurement resistor and comprises an indication of the isolation resistance between chassis ground and the negative bus when the second switch is conducting and the pulse generator delivers a pulse.

Example 3: The isolation measurement circuit of example 2, wherein the isolation measurement circuit is configured to determine whether an isolation ground failure exists by: taking repeated values measured across the measurement resistor over time; and determine whether a measured value deviates by a threshold amount relative to the repeated value measurements.

Example 4: The isolation measurement circuit of example 2 or example 3, further comprising a signal conditioning circuit, wherein the signal conditioning circuit is configured to receive the indication of the isolation resistance, and condition the signal for use by other circuitry.

Example 5: The isolation measurement circuit of example 4, wherein the signal conditioning circuit comprises a differential amplifier.

Example 6: The isolation measurement circuit of any one of examples 1-5, further comprising a capacitance measurement circuit configured to measure a capacitance between chassis ground and at least one the positive bus or the negative bus.

Example 7: The isolation measurement circuit of any one of examples 1-6, further comprising a capacitance measurement circuit configured to measure a capacitance between the positive bus and the negative bus.

Example 8: A power distribution system includes: a power supply configured to supply a load with power, wherein the power supply and load are isolated from a chassis ground for the power distribution system; an isolation measurement circuit includes a first switch connecting a first isolation resistor to a first terminal of a measurement resistor, wherein the first isolation resistor also connects to a positive bus of a power distribution system; a second switch connecting a second isolation resistor to a second terminal of the measurement resistor, wherein the second isolation resistor also connects to a negative bus of the power distribution system; and; a pulse generator that connects the measurement resistor to the chassis ground.

Example 9: The power distribution system of example 8, wherein the isolation measurement circuit is configured to determine a first value and a second value: wherein the first value is measured across the measurement resistor and comprises an indication of an isolation resistance between chassis ground and the positive bus when the first switch is conducting and the pulse generator delivers a pulse, wherein the second value is measured across the measurement resistor and comprises is an indication of the isolation resistance between chassis ground and the negative bus when the second switch is conducting and the pulse generator delivers a pulse.

Example 10: The power distribution system of example 8 or example 9, wherein the isolation measurement circuit is configured to determine whether an isolation ground failure exists by: repeated values measured across the measurement resistor over time; determine whether a measured value deviates by a threshold amount relative to the repeated value measurements.

Example 11: The power distribution system of any one of examples 8-10, further comprising a signal conditioning circuit, wherein the signal conditioning circuit is configured to receive the indication of the isolation resistance, and condition the signal for use by downstream circuitry.

Example 12: The power distribution system of example 10 or example 11, wherein the signal conditioning circuit comprises a differential amplifier.

Example 13: The power distribution system of any one of examples 8-10, further comprising a capacitance measurement circuit configured to measure a capacitance between chassis ground and the positive bus.

Example 14: A method includes: controlling a switch to connect a bus of a power distribution system to a first terminal of a measurement resistor, wherein the bus connects to the first terminal of the measurement resistor through an isolation resistor; applying, by a pulse generator of an isolation measurement circuit, a pulse between a chassis ground and a second terminal of the measurement resistor, measuring a value across the measurement resistor, wherein the value measured across the measurement resistor comprises an indication of an isolation resistance between a chassis ground and the bus when the switch is conducting and the pulse generator delivers the pulse.

Example 15: The method of example 14, wherein the switch is a first switch, the bus is a first bus, and the isolation resistor is a first isolation resistor, wherein the value is a first value, the method further including: controlling the first switch to disconnect the first bus from the first terminal of the measurement resistor; controlling a second to connect a second bus of the power distribution system to the first terminal of the measurement resistor, wherein the second bus connects to the first terminal of the measurement resistor through a second isolation resistor; applying, by the pulse generator of the isolation measurement circuit, a pulse between the chassis ground and the second terminal of the measurement resistor; and measuring a second value across the measurement resistor, wherein the second value measured across the measurement resistor is an indication of the isolation resistance between chassis ground and the second bus when the second switch is conducting and the pulse generator delivers the pulse.

Example 16: The method of example 15, wherein the first switch is conducting when the second switch is not conducting.

Example 17: The method of example 16, further including: performing repeated value measurements across the measurement resistor; and determining whether a measured value deviates by a threshold amount relative to the repeated value measurements.

Example 18: The method of example 16 or example 17, further including: receiving, by a signal conditioning circuit, the indication of the isolation resistance; and conditioning the signal for use by other circuitry.

Example 19: The method of example 18, wherein the signal conditioning circuit comprises a differential amplifier.

Example 20: The method of any one of examples 14-18, further including: measuring a rise time of the value across the measurement resistor, wherein the rise time is an indication of a capacitance between the chassis ground and the bus.

Example 21: The method of any one of examples 15-20, further including: controlling the first switch to connect the first bus to the first terminal of the measurement resistor; applying, by the pulse generator of the isolation measurement circuit, a pulse between the chassis ground and the second terminal of the measurement resistor; and measuring a rise time of a third value across the measurement resistor, wherein the rise time of the third value measured across the measurement resistor is an indication of a capacitance between the first bus and the second bus.

Various examples have been described. These and other examples are within the scope of the following claims.

What is claimed is:

1. An isolation measurement circuit comprising:

a measurement resistor;

measurement circuitry connected across the measurement resistor;

a first switch connecting a first isolation resistor to a terminal of the measurement resistor, wherein the first isolation resistor is configured to connect to a positive bus of a power distribution system such that the first switch is connected on a lower voltage side of the first isolation resistor;

a second switch connecting a second isolation resistor to the terminal of the measurement resistor, wherein the second isolation resistor is configured to connect to a negative bus of the power distribution system such that the second switch is connected on a lower voltage side of the second isolation resistor; and a pulse generator that connects the measurement resistor to chassis ground.

2. The isolation measurement circuit of claim 1, wherein the isolation measurement circuit is configured to determine a first value and a second value:

wherein the first value is measured across the measurement resistor and comprises an indication of the isolation resistance between chassis ground and the positive bus when the first switch is conducting and the pulse generator delivers a pulse, wherein the second value is measured across the measurement resistor and comprises an indication of the isolation resistance between chassis ground and the negative bus when the second switch is conducting and the pulse generator delivers a pulse.

3. The isolation measurement circuit of claim 2, wherein the isolation measurement circuit is configured to determine whether an isolation ground failure exists by:

taking repeated values measured across the measurement resistor over time; and determining whether a measured value deviates by a threshold amount relative to the repeated value measurements.

4. The isolation measurement circuit of claim 2, further comprising a signal conditioning circuit, wherein the signal conditioning circuit is configured to receive an indication of the isolation resistance, and condition the signal for use by other circuitry.

5. The isolation measurement circuit of claim 4, wherein the signal conditioning circuit comprises a differential amplifier.

6. The isolation measurement circuit of claim 1, further comprising a capacitance measurement circuit configured to measure a capacitance between chassis ground and at least one of the positive bus or the negative bus.

7. The isolation measurement circuit of claim 1, further comprising a capacitance measurement circuit configured to measure a capacitance between the positive bus and the negative bus.

8. A power distribution system comprising:

a power supply configured to supply a load with power, wherein the power supply and load are isolated from a chassis ground for the power distribution system;

an isolation measurement circuit comprising:

a measurement resistor;

measurement circuitry connected across the measurement resistor;

a first switch connecting a first isolation resistor to a first terminal of the measurement resistor, wherein the first isolation resistor also connects to a positive bus of a power distribution system such that the first switch is connected on a lower voltage side of the first isolation resistor;

a second switch connecting a second isolation resistor to a second terminal of the measurement resistor, wherein the second isolation resistor also connects to a negative bus of the power distribution system such that the second switch is connected on a lower voltage side of the second isolation resistor; and a pulse generator that connects the measurement resistor to the chassis ground.

9. The power distribution system of claim 8, wherein the isolation measurement circuit is configured to determine a first value and a second value:

wherein the first value is measured across the measurement resistor and comprises an indication of an isolation resistance between chassis ground and the positive bus when the first switch is conducting and the pulse generator delivers a pulse, and wherein the second value is measured across the measurement resistor and comprises is an indication of the isolation resistance between chassis ground and the negative bus when the second switch is conducting and the pulse generator delivers a pulse.

10. The power distribution system of claim 8, wherein the isolation measurement circuit is configured to determine whether an isolation ground failure exists by:

taking repeated values measured across the measurement resistor over time; and determining whether a measured value deviates by a threshold amount relative to the repeated value measurements.

11. The power distribution system of claim 9, wherein the signal conditioning circuit comprises a differential amplifier.

12. The power distribution system of claim 11, further comprising a signal conditioning circuit, wherein the signal conditioning circuit is configured to receive the indication of the isolation resistance, and condition the signal for use by downstream circuitry.

13. The power distribution system of claim 8, further comprising a capacitance measurement circuit configured to measure a capacitance between chassis ground and the positive bus.

14. A method comprising:

controlling a switch to connect a bus of a power distribution system to a first terminal of a measurement resistor, wherein the bus connects to the first terminal of the measurement resistor through an isolation resistor such that the switch is connected on a lower voltage side of the isolation resistor;

applying, by a pulse generator of an isolation measurement circuit, a pulse between a chassis ground and a second terminal of the measurement resistor; and measuring, by measurement circuitry connected across the measurement resistor, a value across the measurement resistor, wherein the value measured across the measurement resistor comprises an indication of an isolation resistance between a chassis ground and the bus when the switch is conducting and the pulse generator delivers the pulse.

15. The method of claim 14, further comprising:

measuring a rise time of the value across the measurement resistor, wherein the rise time is an indication of a capacitance between the chassis ground and the bus.

16. The method of claim 14, wherein the switch is a first switch, the bus is a first bus, and the isolation resistor is a first isolation resistor, wherein the value is a first value, the method further comprising:

controlling the first switch to disconnect the first bus from the first terminal of the measurement resistor;

controlling a second switch to connect a second bus of the power distribution system to the first terminal of the measurement resistor, wherein the second bus connects to the first terminal of the measurement resistor through a second isolation resistor;

applying, by the pulse generator of the isolation measurement circuit, a pulse between the chassis ground and the second terminal of the measurement resistor; and measuring a second value across the measurement resistor, wherein the second value measured across the measurement resistor is an indication of the isolation resistance between chassis ground and the second bus when the second switch is conducting and the pulse generator delivers the pulse.

17. The method of claim 16, further comprising:

controlling the first switch to connect the first bus to the first terminal of the measurement resistor;

applying, by the pulse generator of the isolation measurement circuit, a pulse between the chassis ground and the second terminal of the measurement resistor; and measuring a rise time of a third value across the measurement resistor, wherein the rise time of the third value measured across the measurement resistor is an indication of a capacitance between the first bus and the second bus.

18. The method of claim 16, wherein the first switch is conducting when the second switch is not conducting.

19. The method of claim 18, further comprising determining whether an isolation ground failure exists based on:

performing repeated value measurements across the measurement resistor; and determining whether a measured value deviates by a threshold amount relative to the repeated value measurements.

20. The method of claim 18, further comprising:

receiving, by a signal conditioning circuit, the indication of the isolation resistance; and conditioning the signal for use by other circuitry.

21. The method of claim 20, wherein the signal conditioning circuit comprises a differential amplifier.

* * * * *